(12) United States Patent
Chen et al.

(10) Patent No.: US 12,471,462 B2
(45) Date of Patent: Nov. 11, 2025

(54) ARRAY SUBSTRATE INCLUDING A CONDUCTIVE TRACE LOCATED BETWEEN TWO ADJACENT FILM LAYERS, DISPLAY PANEL AND ELECTRONIC DEVICE HAVING THE SAME

(71) Applicant: YUNGU (GU'AN) TECHNOLOGY CO., LTD., Hebei (CN)

(72) Inventors: Hao Chen, Hebei (CN); Menghua Kang, Hebei (CN); Liwei Ding, Hebei (CN); Rusheng Liu, Hebei (CN)

(73) Assignee: YUNGU (GU'AN) TECHNOLOGY CO., LTD., Hebei (CN)

( * ) Notice: Subject to any disclaimer, the term of this patent is extended or adjusted under 35 U.S.C. 154(b) by 537 days.

(21) Appl. No.: 17/948,615

(22) Filed: Sep. 20, 2022

(65) Prior Publication Data
US 2023/0019842 A1  Jan. 19, 2023

Related U.S. Application Data

(63) Continuation of application No. PCT/CN2021/089702, filed on Apr. 25, 2021.

(30) Foreign Application Priority Data

Jul. 8, 2020  (CN) .......................... 202010652527.8

(51) Int. Cl.
| | |
|---|---|
| H10K 59/13 | (2023.01) |
| H10K 59/131 | (2023.01) |
| H10K 59/179 | (2023.01) |
| H10D 86/40 | (2025.01) |
| H10D 86/60 | (2025.01) |

(52) U.S. Cl.
CPC ......... *H10K 59/131* (2023.02); *H10K 59/179* (2023.02); *H10D 86/441* (2025.01); *H10D 86/60* (2025.01)

(58) Field of Classification Search
CPC .. H10K 59/131; H10K 59/179; H10D 86/441; H10D 86/60
USPC .......................................................... 257/72
See application file for complete search history.

(56) References Cited

U.S. PATENT DOCUMENTS

2020/0212356 A1*  7/2020  Kim .................... H10K 59/122

FOREIGN PATENT DOCUMENTS

| CN | 101540340 A | * | 9/2009 |
|---|---|---|---|
| CN | 101055685 B | | 12/2012 |
| CN | 109599052 A | | 4/2019 |
| CN | 109712996 A | | 5/2019 |
| CN | 109920806 A | * | 6/2019 |

(Continued)

OTHER PUBLICATIONS

Cite the machine translation Zhong J (CN-109920806-A).*
(Continued)

*Primary Examiner* — Phuc T Dang
(74) *Attorney, Agent, or Firm* — Maier & Maier, PLLC

(57) ABSTRACT

An array substrate, a display panel and an electronic device, where the array substrate includes a transparent display region and a non-transparent display region adjacent to the transparent display region, the transparent display region includes a plurality of film layers stacked in sequence and a conductive trace located between any two adjacent films layers, and the conductive trace is arranged in a shape of a preset function curve.

20 Claims, 11 Drawing Sheets

(56) References Cited

FOREIGN PATENT DOCUMENTS

| CN | 110289304 | A |   | 9/2019  |           |
|----|-----------|---|---|---------|-----------|
| CN | 110767711 | A | * | 2/2020  | G09G 3/3233 |
| CN | 110767714 | A |   | 2/2020  |           |
| CN | 110767824 | A |   | 2/2020  |           |
| CN | 110808263 | A |   | 2/2020  |           |
| CN | 111034183 | A |   | 4/2020  |           |
| CN | 111047967 | A |   | 4/2020  |           |
| CN | 111834429 | A |   | 10/2020 |           |
| WO | WO-2019/127256 | | * | 7/2019  |           |

OTHER PUBLICATIONS

Cite the machine translation Zhang X (CN-101540340-A).*
Cite the machine translation Jia Z (CN-110767711-A).*
Cite machine translation Chen D (WO-2019/127256).*
International Search Report issued on Jul. 14, 2021 in corresponding Application No. PCT/CN2021/089702, 14 pages.
Chinese Office Action issued on Oct. 20, 2021 in corresponding Chinese Application No. 202010652527.8, 12 pages.
Chinese Office Action issued on Jan. 17, 2022 in corresponding Chinese Application No. 202010652527.8, 13 pages.
Decision on Rejection issued Apr. 29, 2022 in corresponding Chinese Application No. 202010652527.8, 5 pages.

* cited by examiner

ARRAY SUBSTRATE INCLUDING A CONDUCTIVE TRACE LOCATED BETWEEN TWO ADJACENT FILM LAYERS, DISPLAY PANEL AND ELECTRONIC DEVICE HAVING THE SAME

CROSS-REFERENCE TO RELATED APPLICATIONS

The present application is a continuation of International Application No. PCT/CN2021/089702, filed on Apr. 25, 2021, which claims priority to Chinese Patent Application No. 202010652527.8, filed with China National Intellectual Property Administration on Jul. 8, 2020, and entitled "ARRAY SUBSTRATE, DISPLAY PANEL AND ELECTRONIC DEVICE". The disclosures of the aforementioned applications are incorporated herein by reference in their entireties.

TECHNICAL FIELD

The present disclosure relates to the field of display technology, and in particular, to an array substrate, a display panel and an electronic device.

BACKGROUND

With the rapid development of electronic devices, full-screen display has become a development trend of electronic devices such as mobile phones. In order to achieve full-screen display, a photosensitive element such as a camera is usually disposed under a display panel to form an under-screen camera.

In the electronic device using the under-screen camera, the display panel usually includes a transparent display region and a non-transparent display region surrounding the transparent display region, and the photosensitive element such as the under-screen camera corresponds to the transparent display region in position. The transparent display region includes a plurality of film layers stacked in sequence and conductive traces located between any adjacent film layers, and external light passes through gaps between the adjacent conductive traces and enters the photosensitive element below the display panel, thereby obtaining an image.

However, a diffraction phenomenon occurs when light passes through the gaps between adjacent conductive traces, resulting in poor quality of the image obtained by the photosensitive element.

SUMMARY

In view of the above problem, embodiments of the present disclosure provide an array substrate, a display panel and an electronic device so as to improve a diffraction phenomenon occurred when light passes through a transparent display region, and to improve quality of an image obtained by a photosensitive element.

In order to achieve the above purpose, embodiments of the present disclosure provide the following technical solutions:

A first aspect of the embodiments of the present disclosure provides an array substrate, including: a transparent display region and a non-transparent display region adjacent to the transparent display region; the transparent display region includes a plurality of film layers stacked in sequence and a conductive trace located between any two adjacent films layers; the conductive trace is arranged in a shape of a preset function curve.

A second aspect of the embodiments of the present disclosure provides a display panel, including: the array substrate provided in the first aspect, a light-emitting layer disposed on the array substrate and an encapsulation layer capped on the light-emitting layer.

A third aspect of the embodiments of the present disclosure provides an electronic device, including: the display panel provided in the second aspect and at least one photosensitive element; the photosensitive element is disposed on a side of the display panel facing away a light emitting surface, and the photosensitive element corresponds to the transparent display region.

The array substrate, the display panel and the electronic device provided by the embodiments of the present disclosure have the following advantages:

In the array substrate provided in the embodiments of the present disclosure, the conductive trace between any two adjacent film layers in the transparent display region is arranged in a shape of a preset function curve, so that a shape of a gap between the adjacent conductive traces exhibits an irregular distribution or a disorder distribution, which destroys structural periodicity of the gap between the adjacent conductive traces, thereby improving the diffraction phenomenon of the display panel, and then improving the quality of the image obtained by the photosensitive element.

In addition to the technical problem solved by the embodiments of the present disclosure, the technical features that constitute the technical solutions, and the beneficial effects brought by the technical features of these technical solutions as described above, other technical problems that can be solved by the array substrate, the display panel and electronic device and of the embodiments of the present disclosure, other technical features included in the technical solutions, and the beneficial effects brought by these technical features will be further explained in detail in the specific embodiments.

BRIEF DESCRIPTION OF THE DRAWINGS

In order to more clearly illustrate technical solutions in embodiments of the present disclosure or the prior art, drawings that need to be used in the description of the embodiments or the prior art will be briefly introduced below. Obviously, the drawings in the following description are some embodiments of the present disclosure, and for those ordinary skilled in the art, other drawings may also be obtained according to these drawings without creative work.

DETAILED DESCRIPTION OF THE EMBODIMENTS

Figure 1:
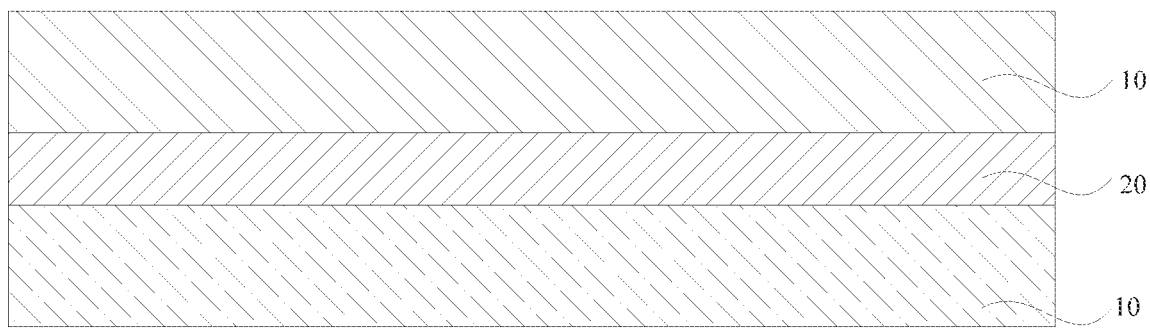
FIG. 1 is a structural schematic view of an array substrate provided by an embodiment of the present disclosure.

One of the main reasons why a diffraction phenomenon occurs when light passes through a transparent display region is: conductive traces between any adjacent film layers in the transparent display region are usually straight and arranged at intervals in parallel, gaps formed between adjacent conductive traces are in a regular shape such as a rectangular shape, and are regularly arranged. When light passes through the gaps between the adjacent conductive traces, the diffraction phenomenon may occur, thereby forming diffraction fringes or halos, resulting in poor quality of an image obtained by a photosensitive element, and even defects such as image distortion.

In order to solve the above problems, in an array substrate provided by an embodiment of the present disclosure, the conductive trace between any two adjacent film layers in the transparent display region is arranged in a shape of a preset function curve, so that the shape of the gap between the adjacent conductive traces exhibit an irregular distribution or a disorder distribution, which destroys a structural periodicity of the gap between the adjacent conductive traces, thereby improving a diffraction phenomenon generated when light passes through the transparent display region, and then improving quality of the image obtained by the photosensitive element, and avoiding defects such as image distortion.

In order to make the above objects, features and advantages of embodiments of the present disclosure more apparent and easy to understand, the technical solutions in the embodiments of the present disclosure will be clearly and completely described below in conjunction with the drawings in the embodiments of the present disclosure. Obviously, the described embodiments are part of embodiments of the present disclosure, but not all embodiments. Based on the embodiments of the present disclosure, all other embodiments obtained by those of ordinary skill in the art without creative efforts would fall within the protection scope of the present disclosure.

An electronic device provided by the embodiments of the present disclosure may be a mobile phone, a tablet computer and a wearable device and other electronic device, and the following will take the mobile phone as an example for description.

The electronic device provided by the embodiments of the present disclosure generally includes a display panel and a photosensitive element disposed under the display panel, where the photosensitive element may be, for example, a camera, an image sensor or a photodiode, and in the display panel, a region corresponding to the photosensitive element is a transparent display region, and other display region is a non-transparent display region. The non-transparent display region may be disposed around the transparent display region; or the transparent display region may be disposed close to a frame, and only a part of the non-transparent display region surrounds the transparent display region, etc. External light may pass through the transparent display region and enter the photosensitive element located under the display panel, so as to realize the purpose of obtaining images by the photosensitive element.

Where the display panel may be an organic light-emitting diode (OLED) display panel, a liquid crystal panel or a micro-plane display panel (Micro-OLED or Micro-LED), etc. The following description will be given by taking an OLED display panel as an example.

The display panel generally includes an array substrate, a light-emitting layer disposed on the array substrate, and an encapsulation layer capped on light-emitting layer; a region of light-emitting layer corresponding to the transparent display region is a transparent region.

In the above display panel, the array substrate is used to carry other components of the display panel, and to control current flowing into light-emitting layer. As shown in FIG. 1, in the region of the array substrate corresponding to the transparent display region, the array substrate includes a plurality of film layers 10 stacked in sequence and a conductive trace 20 located between any two adjacent film layers 10, and the conductive trace 20 is arranged in a shape of preset function curve. Where there are a plurality of conductive traces 20, and the plurality of conductive traces 20 may be located in the same film layer, or may be located in different film layers. It should be noted that, materials of the plurality of film layers 10 in the transparent display region may be materials used in common array film layers, or may also be highly transparent materials, and this is not limited in this embodiment.

The conductive trace 20 is arranged in a preset function curve between any two adjacent film layers 10, that is, the conductive trace 20 is extended according to the preset function curve. By adjusting the shape of each conductive trace 20, and a spacing between the adjacent conductive traces 20, for example, the shape of the gap formed between the adjacent conductive traces 20 is an irregular shape, which destroys structural periodicity between the adjacent conductive traces, thereby improving a diffraction phenomenon generated when the external light passes through the transparent display region, and then improving the quality of the image obtained by the photosensitive element, and avoiding defects such as image distortion.

Where a material of the conductive trace 20 may be a conductive material such as molybdenum, titanium, aluminum, copper, silver, indium tin oxide or transparent conductive polymer, and the scope thereof is not limited.

In some embodiments, the array substrate includes a base substrate, a thin film transistor (TFT) array layer disposed on the base substrate, and a flat layer disposed on the TFT array layer, etc.

Where the base substrate may be a rigid substrate, such as a glass substrate; it may also be a flexible substrate, and its material may be polyimide, polystyrene, polyethylene terephthalate, parylene, polyether sulfone or polyethylene naphthalate. The base substrate is mainly used to support components disposed thereon.

The TFT array layer usually includes a gate insulation layer, a gate electrode disposed on the gate insulation layer, an interlayer insulation layer arranged on the gate insulation layer and the gate electrode, a source/drain electrode disposed on the interlayer insulation layer, and a planarization layer disposed on the interlayer insulation layer and the source/drain electrode.

Where a trace of the gate electrode may be arranged in a preset function curve, so that a shape of a gap between adjacent traces of the gate electrode exhibits an irregular distribution or a disorder distribution, which destroys structural periodicity of the gap between adjacent traces of the gate electrode. Therefore, diffraction is not easy to occur when an external light passes through the gap between adjacent traces of the gate electrode, so that the diffraction phenomenon generated when light passes through the transparent display region can be improved, thereby improving the quality of the image obtained by the photosensitive element, and avoiding defects such as image distortion.

Traces of the source/drain electrode disposed between the interlayer insulation layer and the planarization layer may also be arranged in a preset function curve, so that a shape of a gap between adjacent traces of the source or drain electrode exhibits an irregular distribution or a disorder distribution, which destroys structural periodicity of the gap between adjacent traces of the source or drain electrode. Therefore, diffraction is not easy to occur when the external light passes through the gap between traces of adjacent source or drain electrode, so that the diffraction phenomenon generated when light passes through the transparent display region can be improved, thereby improving the quality of the image obtained by the photosensitive element, and avoiding defects such as image distortion.

Or, both the trace of the gate electrode and the trace of the source/drain electrode disposed between the interlayer insulation layer and the planarization layer are arranged in a preset function curve to improve the diffraction phenomenon generated when light passes through the transparent display region, thereby improving the quality of the image obtained by the photosensitive element, and avoiding defects such as image distortion.

It is to be noted that conductive traces in other film layers in the array substrate may also be arranged in a preset function curve to improve the diffraction phenomenon generated when light passes through the transparent display region, thereby improving the quality of the image obtained by the photosensitive element, and avoiding defects such as image distortion. In this embodiment, they are not enumerated.

In the above array substrate, the conductive trace 20 between any two adjacent film layers 10 may include a plurality of repeating units.

Where the repeating unit may include a trigonometric function curve, a straight line, or other function curves, etc. Among them, the trigonometric function curve includes a cosine function curve, a sine function curve, etc.

In one embodiment, the repeating unit includes multiple segments of sine function curves connected in sequence, and the sine function curves are periodically arranged in the repeating unit. That is, each of the conductive traces 20 includes multiple segments of sine function curves periodically connected in sequence, so that a diffraction is not easy to occur when the external light passes through an irregular gap between adjacent conductive traces 20 arranged in a sine function curve, so that the diffraction phenomenon generated when light passes through the transparent display region can be improved, thereby improving the quality of the image obtained by the photosensitive element, and avoiding defects such as image distortion.

Optionally, the repeating unit may include multiple segments of sine function curves and multiple segments of straight lines, both of which are connected in sequence, and the respective sine function curves and the respective straight lines are alternatively arranged at intervals, so that a diffraction is not easy to occur when light passes through the irregular gap between the adjacent conductive traces 20, thereby improving the quality of the image obtained by the photosensitive element.

Optionally, the repeating unit may also include multiple segments of cosine function curves connected in sequence, and the cosine function curves are periodically arranged in the repeating unit, so that a diffraction is not easy to occur when light passes through the irregular gap between the adjacent conductive traces 20, thereby improving the quality of the image obtained by the photosensitive element.

Figure 2:
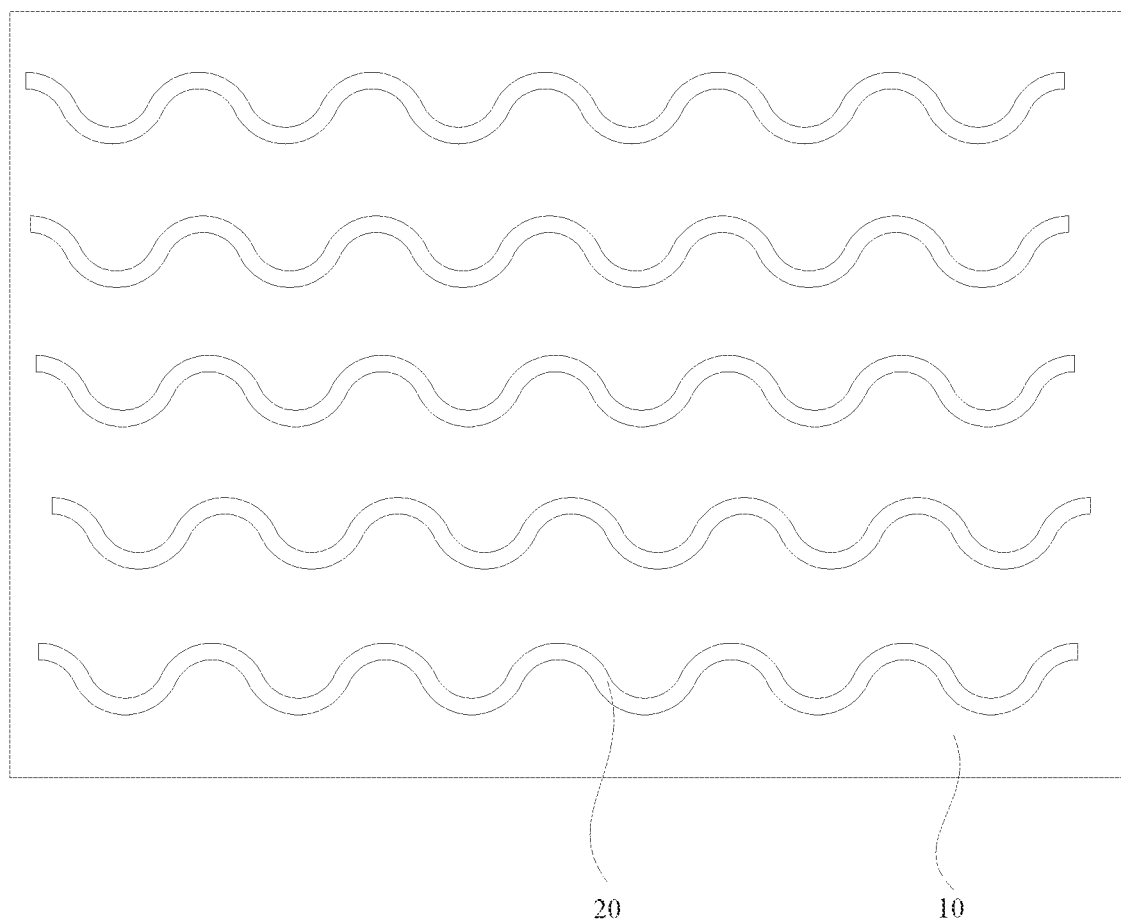
FIG. 2 is a schematic top view of a first shape of conductive traces in an array substrate provided by an embodiment of the present disclosure.
Figure 3:
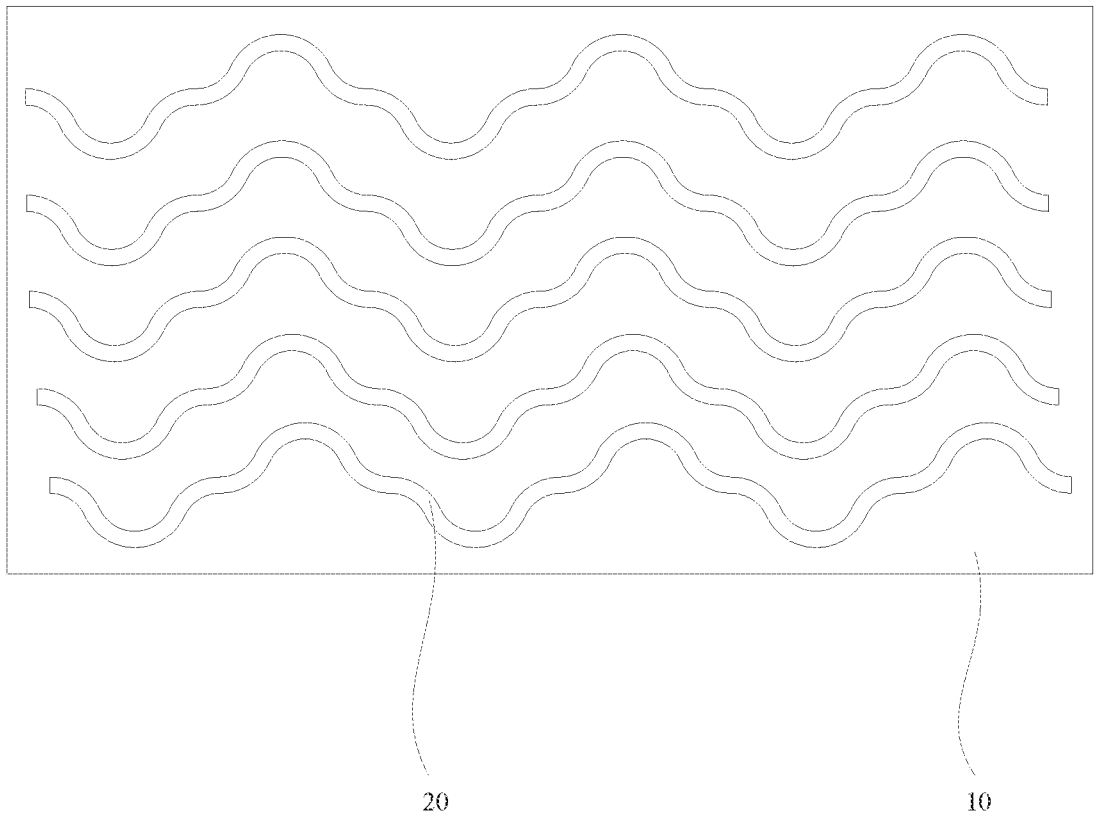
FIG. 3 is a schematic top view of a second shape of conductive traces in an array substrate provided by an embodiment of the present disclosure.

Exemplarily, as shown in FIG. 2, the repeating unit includes multiple segments of cosine function curves connected in sequence, and any two adjacent cosine function curves have the same direction; or, as shown in FIG. 3, any two adjacent cosine function curves are in opposite directions, so that a diffraction is not easy to occur when light passes through the irregular gap between the adjacent conductive traces 20, thereby improving the quality the image obtained by the photosensitive element.

It is to be noted that, in FIG. 2, in a segment of cosine function curve, a lowest point and an adjacent highest point in the curve belong to a cosine function; while in FIG. 3, in a segment of cosine function curve, a lowest point and an adjacent highest point in the curve belong to two cosine functions.

Figure 4:
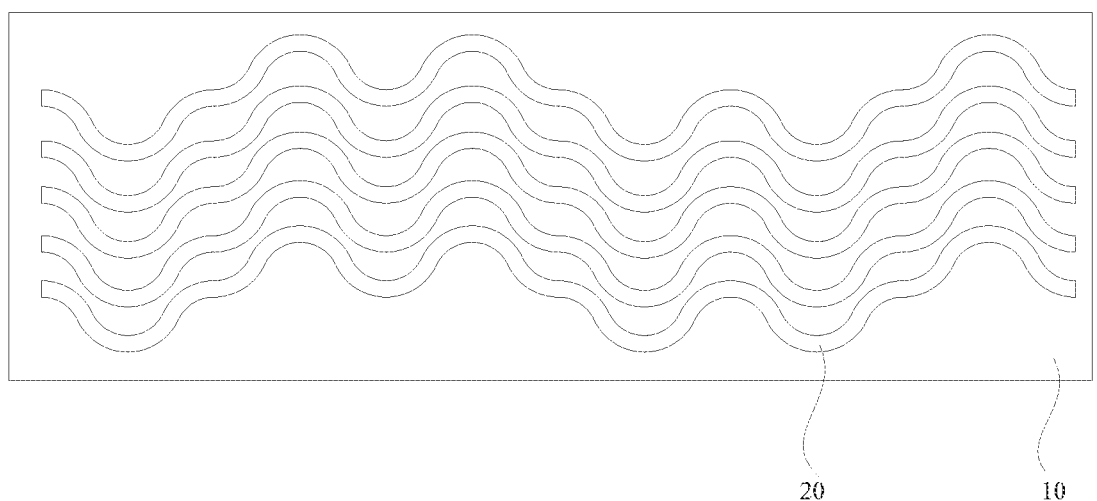
FIG. 4 is a schematic top view of a third shape of conductive traces in an array substrate provided by an embodiment of the present disclosure.

In yet another embodiment, as shown in FIG. 4, taking a single cosine function curve as a unit, two adjacent segments of cosine function curves can have same or opposite directions, and can be arbitrarily combined, so that a diffraction is not easy to occur when light passes through the irregular gap between the adjacent conductive traces 20, thereby improving the quality of the image obtained by the photosensitive element.

Optionally, the repeating unit includes multiple segments of cosine function curves and multiple segments of straight lines, and the respective cosine function curves and the respective straight lines are alternately disposed at intervals, so that a diffraction is not easy to occur when light passes through the irregular gap between the adjacent conductive traces 20, thereby improving the quality of the image obtained by the photosensitive element.

Figure 5:
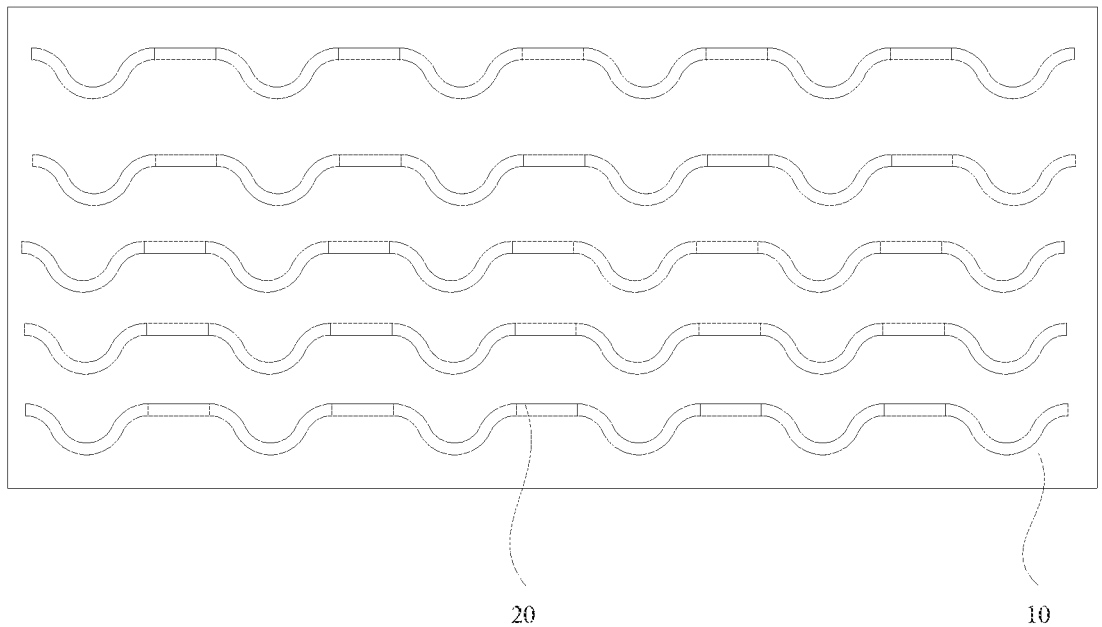
FIG. 5 is a schematic top view of a fourth shape of conductive traces in an array substrate provided by an embodiment of the present disclosure.

Exemplarily, as shown in FIG. 5, the repeating unit includes multiple segments of cosine function curves and multiple segments of straight lines, where the multiple segments of cosine function curves have the same direction, and the respective cosine function curves and the respective straight lines are alternately disposed at intervals, so that a diffraction is not easy to occur when light passes through the irregular gap between the adjacent conductive traces 20, thereby improving the quality of the image obtained by the photosensitive element.

Figure 6:
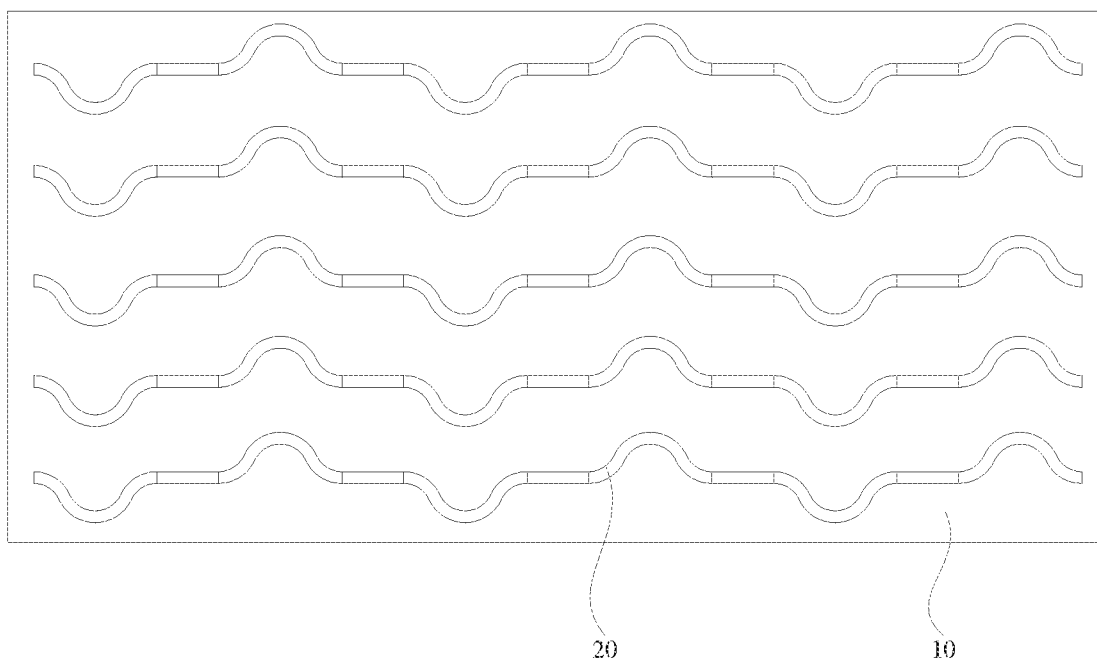
FIG. 6 is a schematic top view of a fifth shape of conductive traces in an array substrate provided by an embodiment of the present disclosure.

As shown in FIG. 6, the repeating unit includes multiple segments of cosine function curves and multiple segments of straight lines, where directions of any two adjacent cosine function curves are opposite, and one segment of straight line is interposed between any two adjacent cosine function curves with opposite directions, so that a diffraction is not easy to occur when light passes through the irregular gap between the adjacent conductive traces 20, thereby improving the quality of the image obtained by the photosensitive element.

Figure 7:
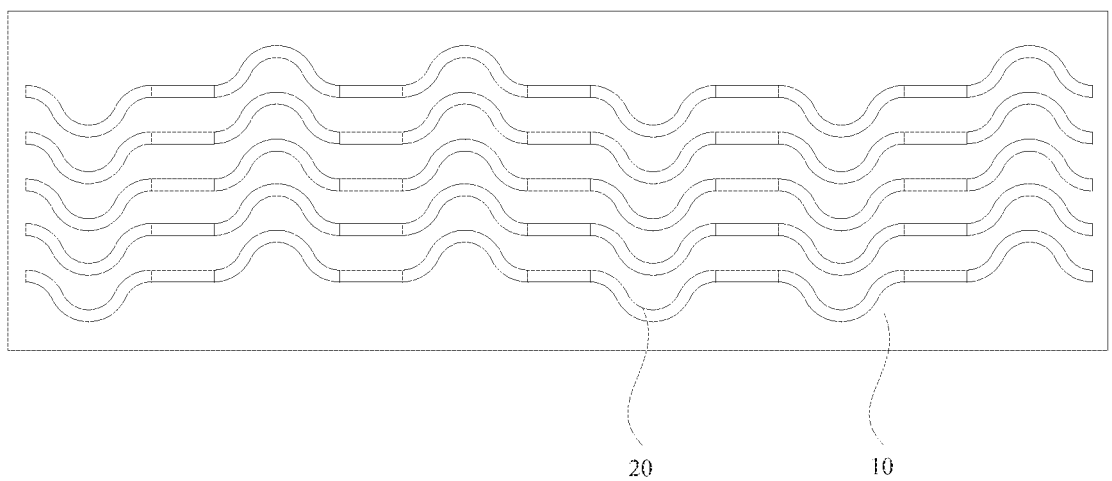
FIG. 7 is a schematic top view of a sixth shape of conductive traces in an array substrate provided by an embodiment of the present disclosure.

In another optional embodiment, as shown in FIG. 7, the repeating unit includes multiple segments of cosine function curves and multiple segments of straight lines, where a single cosine function curve is taken as a unit, and the cosine function curves are alternately disposed with the straight lines, and directions of two units of cosine function curves at two ends of the straight lines are the same or opposite, so that a diffraction is not easy to occur when light passes through the irregular gap between the adjacent conductive traces 20, thereby improving the quality of the image obtained by the photosensitive element.

Optionally, the repeating unit includes multiple segments of sine function curves and multiple segments of cosine function curves, and the respective sine function curves and the respective cosine function curves are alternately arranged at intervals.

Optionally, the repeating unit includes multiple segments of sine function curves, multiple segments of cosine function curves and multiple segments of straight lines, and the respective sine function curves, the respective cosine function curves and the respective straight lines are alternately disposed at intervals.

Optionally, the repeating unit may also include cosine function curves, sine function curves, straight lines and other function curves, and these function curves and the straight lines may be arbitrarily combined, as long as the fact that gap between the adjacent conductive traces 20 exhibits an irregular shape or an irregular distribution, the diffraction phenomenon generated when light passes through the gap between the adjacent conductive traces 20 can be improved, and the quality of the image obtained by the photosensitive element can be improved. It is not limited in this embodiment.

On the basis of the above embodiments, a function period, an amplitude of the conductive traces 20 and a size of the gap between the adjacent conductive traces, for example, may also be changed, so that a diffraction is not easy to occur when light passes through the gap between the adjacent conductive traces 20, so as to achieve the purpose of improving the diffraction phenomenon and improving the quality of the image obtained by the photosensitive element.

Figure 8:
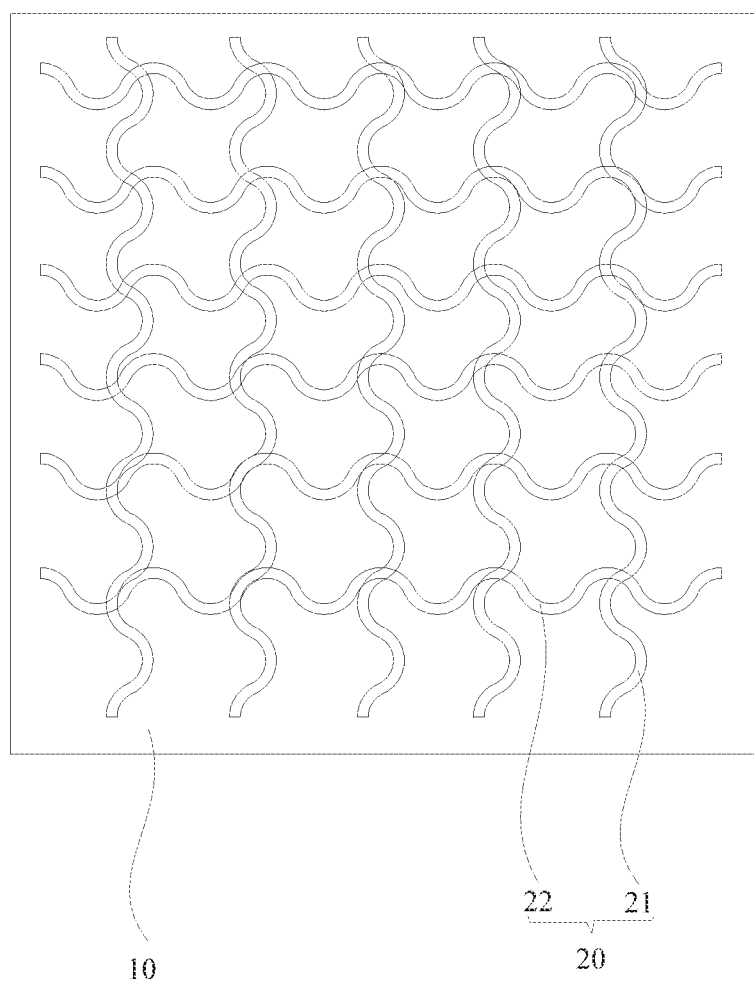
FIG. 8 is a schematic top view of a seventh shape of conductive traces in an array substrate provided by an embodiment of the present disclosure.

In an optional implementation, as shown in FIG. 8, conductive traces 20 in a transparent display region include a plurality of first conductive traces 21 and a plurality of second conductive traces 22, the first conductive traces and the second conductive traces are arranged to transversely and longitudinally cross each other. Where the plurality of first conductive traces 21 may extend in a longitudinal direction, the plurality of second conductive traces may extend in a transverse direction, or the plurality of first conductive traces 21 may extend in the transverse direction, and the plurality of second conductive traces may extend in the longitudinal direction, and the first conductive traces 21 and the second conductive traces 22 may be approximately vertical. That is, the first conductive traces 21 and the second conductive traces 22, which transversely and longitudinally cross each other, may be vertical, or may be skewed. It is not limited in this embodiment.

Where the first conductive traces 21 are arranged in a first preset function curve, and the second the conductive traces 22 are arranged in a second preset function curve. For example, the first conductive traces 21 are arranged in a sine function curve, and the second conductive traces 22 are arranged in a cosine function curve; or, the first conductive traces 21 are arranged in a sine function curve, and the second conductive traces 22 are arranged in a straight line; or, the first conductive traces 21 are arranged in a cosine function curve, and the second conductive traces 22 are arranged in a straight line; or, the first conductive traces 21 and the second the conductive traces 22 are both arranged in a cosine function curve or a sine function curve, etc., so that the gaps that is passed through and between adjacent conductive traces 20 are in an irregular shape or irregularly distributed, thereby improving the diffraction phenomenon generated when light passes through the gaps between the adjacent conductive traces 20, thereby improving the quality of the image obtained by the photosensitive element.

Further, it is also possible to change arrangement periods and amplitudes of the first conductive traces 21 and the second the conductive traces 22, so that the diffraction is not easy to occur when light passes through the gaps between the adjacent conductive traces 20, thereby improving the quality of the image obtained by the photosensitive element.

Figure 9:
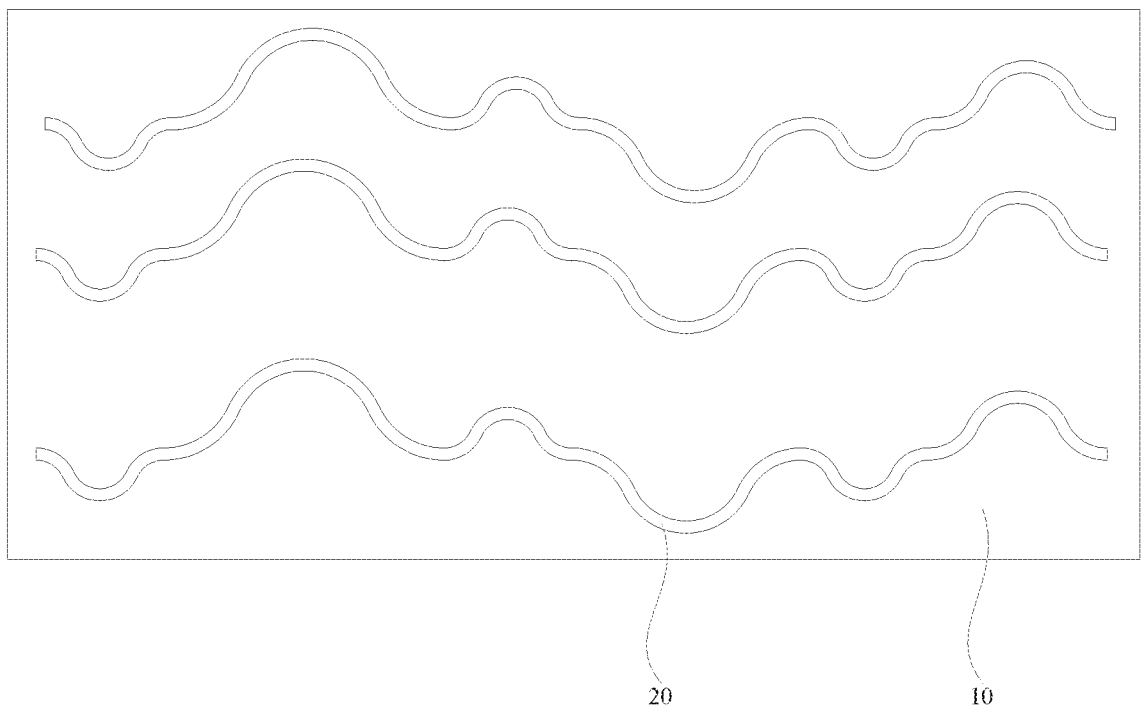
FIG. 9 is a schematic top view of a eighth shape of conductive traces in an array substrate provided by an embodiment of the present disclosure.
Figure 10:
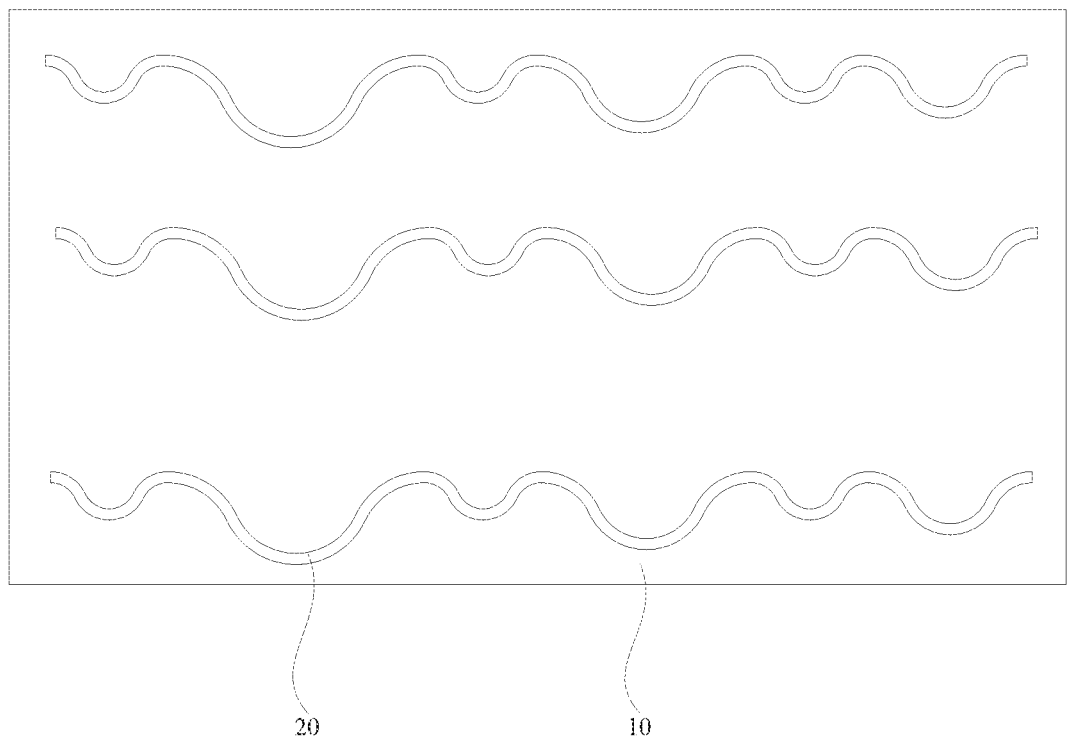
FIG. 10 is a schematic top view of a ninth shape of conductive traces in an array substrate provided by an embodiment of the present disclosure.
Figure 11:
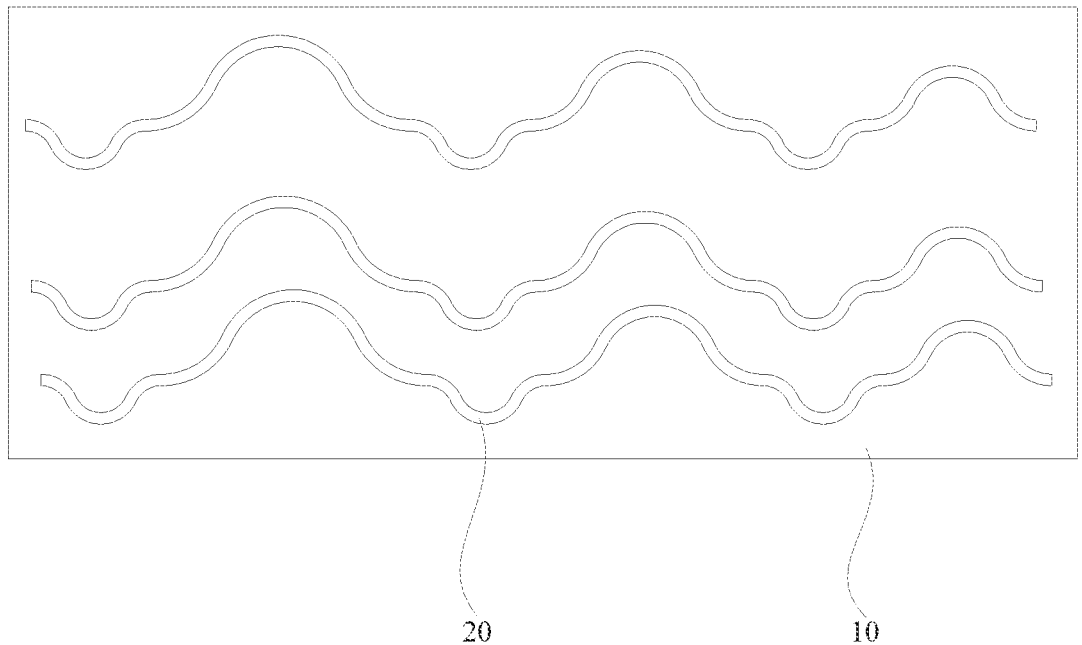
FIG. 11 is a schematic top view of a tenth shape of conductive traces in an array substrate provided by an embodiment of the present disclosure.

Optionally, a period, an amplitude and a direction of the function curve in the conductive traces and the size of the gap between the adjacent conductive traces may all be changed. As shown in FIG. 9, FIG. 10 and FIG. 11, adjacent cosine function curves have different periods and amplitudes, same or opposite directions, and the size of the gap between the adjacent conductive traces is changed, so that a shape of the gap between the adjacent conductive traces exhibits an irregular distribution or a disorder distribution, which destroys a structural periodicity of the gap between the adjacent conductive traces, thereby improving the diffraction phenomenon of the display panel, and improving the quality of the image obtained by the photosensitive element.

Figure 12:
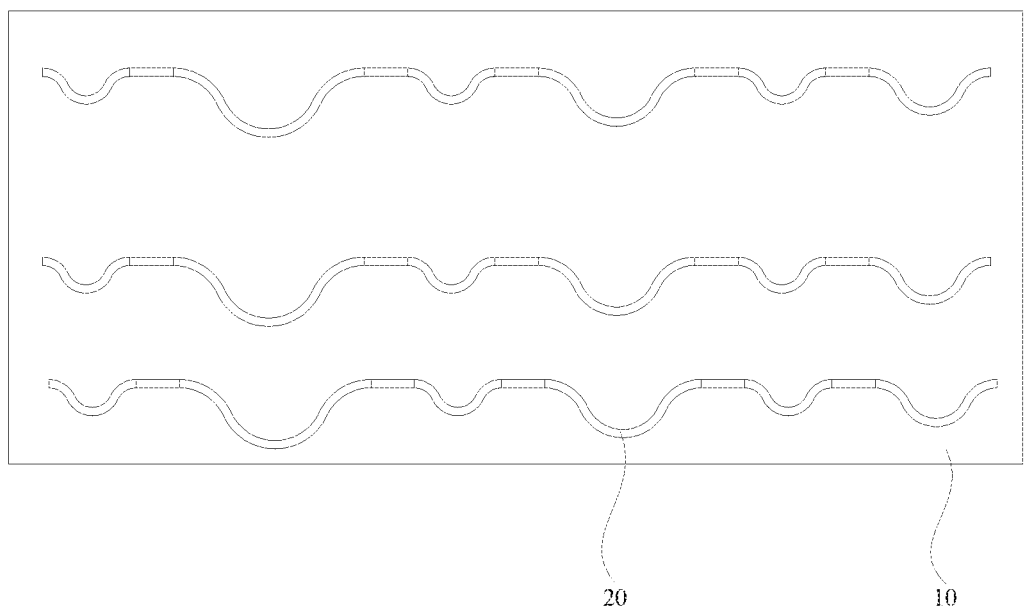
FIG. 12 is a schematic top view of an eleventh shape of conductive traces in an array substrate provided by an embodiment of the present disclosure.
Figure 13:
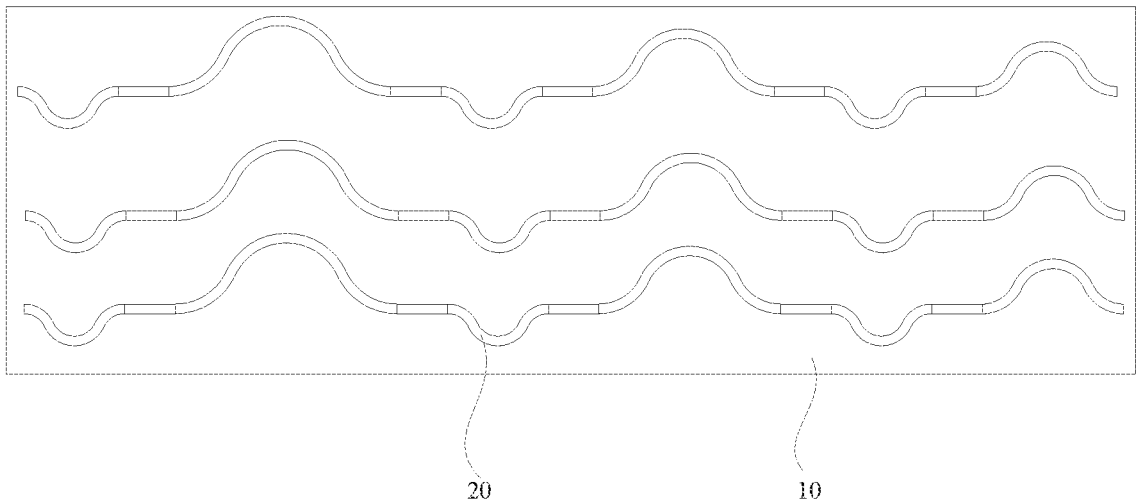
FIG. 13 is a schematic top view of a twelfth shape of conductive traces in an array substrate provided by an embodiment of the present disclosure.
Figure 14:
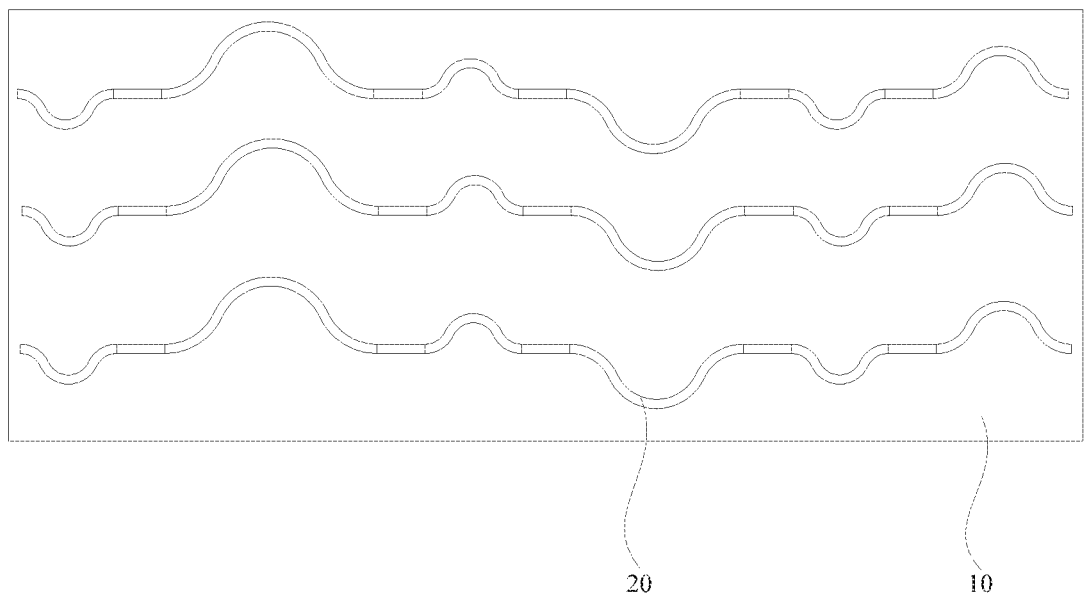
FIG. 14 is a schematic top view of a thirteenth shape of conductive traces in an array substrate provided by an embodiment of the present disclosure.

Optionally, the conductive traces include a function curve and a straight line. By changing the period, the amplitude and the direction of the function curve and setting the function curve to be spaced apart from the straight line (for example, as shown in FIG. 12, FIG. 13 and FIG. 14, the function curve is a cosine function curve, adjacent cosine function curves have different periods and amplitudes, and have the same or opposite directions, and the cosine function curves are disposed apart from straight lines), the shape of the gap between the adjacent conductive traces exhibit an irregular distribution or a disorder distribution, which destroys the structural periodicity of the gap between the adjacent conductive traces, thereby improving the diffraction phenomenon of the display panel, and improving the quality of the image obtained by the photosensitive element.

It is to be noted that the function curve in the conductive trace may also be other function curves such as sine function curves, as long as the amplitude, the period and the direction of the function curve and the size of the gap between the adjacent conductive traces, etc. can be changed to enable the shape of the gap between the adjacent conductive traces to exhibit an irregular distribution or a disorder distribution, and destroy the structural periodicity of the gaps between adjacent conductive traces. In this regard, it is not specifically limited in this embodiment.

Where conductive traces in the non-transparent display region may also be arranged in a preset function curve. In this way, consistency of the processing process of the conductive traces in the non-transparent display region and the transparent display region is facilitated, thereby improving a processing efficiency of the conductive traces.

Figure 15:
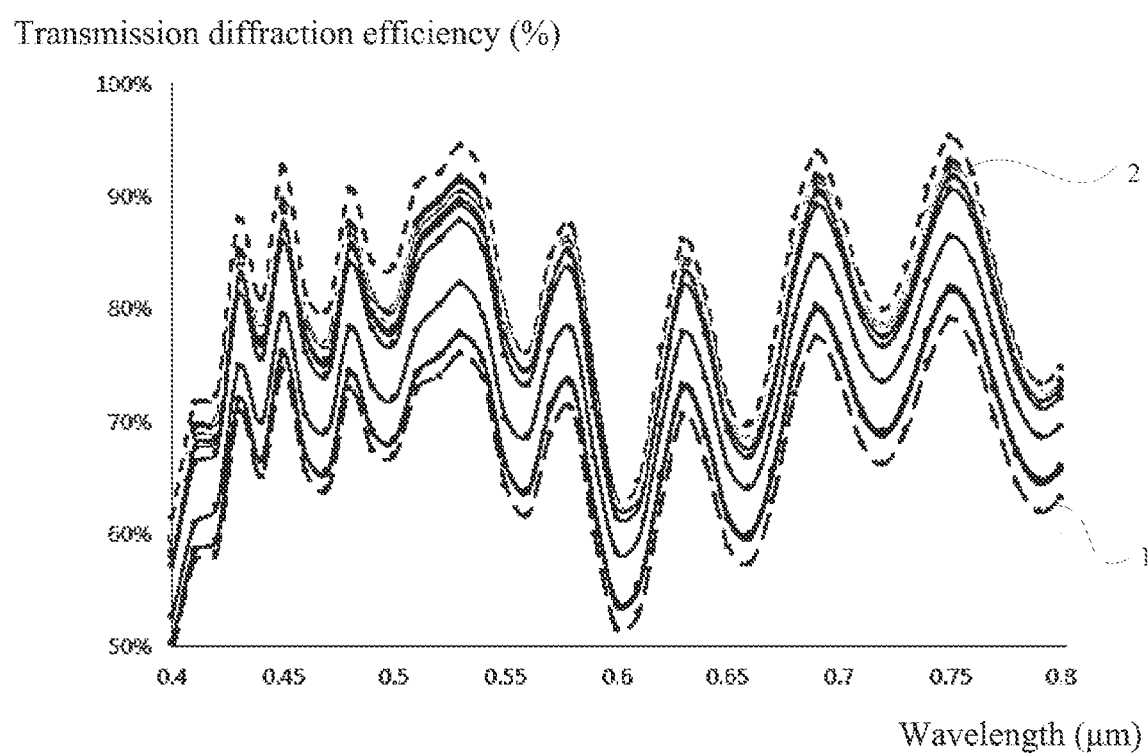
FIG. 15 is a schematic diagram of simulation of zero-order transmission diffraction efficiency of conductive traces in an array substrate provided by an embodiment of the present disclosure.

Further, FIG. 15 is a schematic diagram of a simulation result of zero-order transmission diffraction efficiency of conductive trace model in an array substrate according to an embodiment of the present disclosure, wherein taking the conductive trace 20 that is arranged in a cosine function curve as an example, analogue simulations are carried out on zero-order transmission diffraction efficiencies of a conductive trace model arranged in a cosine function curve, of a traditional conductive trace model arranged in a straight line and of a model without a conductive trace, and the simulation results are compared. As shown in FIG. 15, Line 1 in the figure represents a zero-order transmission diffraction efficiency of the traditional conductive trace model arranged in a straight line, Line 2 in the figure represents a zero-order transmission diffraction efficiency of the model without a conductive trace, lines between Line 1 to Line 2 represent zero-order transmission diffraction efficiencies of conductive trace models arranged in a cosine function curve provided in this embodiment. Periods of single conductive trace function curves increase sequentially from bottom to top. It can be seen from FIG. 15 that in the conductive trace model arranged in the cosine function curve, when the period of the function curve of the single conductive trace model is greater than or equal to 18 and an amplitude thereof is greater than or equal to 3, the simulation results of the zero-order transmission diffraction efficiency of the conductive trace model arranged in the cosine function curve do not change significantly, and are close to the results of the model without a conductive trace. Therefore, in this embodiment, by changing the arrangement shape of the conductive trace, the diffraction phenomenon of a screen body can be improved, without need to add additional process conditions, and the implementation is convenient.

In the above display panel, the light-emitting layer includes a plurality of light-emitting units arranged in an array and a pixel definition layer for isolating the light-emitting units, and in the transparent display region, the pixel definition layer may be a transparent layer, so as to increase light transmission to the photosensitive element located under the array substrate.

The encapsulation layer capped on the light-emitting layer generally includes a plurality of encapsulation units repeatedly stacked, and each encapsulation unit includes an inorganic thin film and an organic thin film, which are stacked. Where the inorganic thin film is generally selected from transparent oxide, fluoride and silicon nitride series.

Generally, an anode layer is further formed on the array substrate, and a material of the anode layer is generally a material with a high work function so as to improve a hole injection efficiency, and may be gold (Au), platinum (Pt), titanium (Ti), silver (Ag), indium tin oxide (ITO), zinc tin oxide (IZO), or transparent conductive polymer (such as polyaniline), etc. In this regard, it is not limited in this embodiment.

A light-emitting layer is disposed on the anode layer, a cathode layer is disposed on the light-emitting layer, and a material of the cathode layer generally adopts a material with a low work function, so as to inject electrons as well as to reduce heat generated during operation, and prolong the service life of the OLED device. The material of the cathode layer may be one of metal materials such as silver (Ag), aluminum (Al), lithium (Li), magnesium (Mg), ytterbium (Yb), calcium (Ca) or indium (In), etc., or may be an alloy of the foregoing metal materials, such as magnesium-silver alloy (Mg/Ag) and lithium-aluminum alloy (Li/Al), and in this regard, it is not limited in this embodiment.

In the array substrate provided in the embodiments of the present disclosure, the conductive traces between any two adjacent film layers in the transparent display region are arranged in a shape of preset function curve, so that the shape of the gap between the adjacent conductive traces exhibits an irregular distribution or a disorder distribution, which destroys the structural periodicity of the gap between the adjacent conductive traces, thereby improving the diffraction phenomenon generated when light passes through the transparent display region, and then improving the quality of the image obtained by the photosensitive element, and avoiding defects such as image distortion.

In this specification, the embodiments or implementations are described in a progressive manner, each embodiment focuses on the difference from other embodiments, and the same and similar parts between the embodiments may be referred to each other.

Finally, it should be noted that the above embodiments are merely intended for describing the technical solutions of the present disclosure other than limiting the present disclosure. Although the present disclosure is described in detail with reference to the foregoing embodiments, persons of ordinary skill in the art should understand that they may still make modifications to the technical solutions described in the foregoing embodiments or make equivalent substitutions to part or all of the technical features therein; and these modifications or substitutions do not make the essence of corresponding technical solutions depart from the scope of the technical solutions of the embodiments of the present disclosure.

What is claimed is:

1. An array substrate, comprising:
a transparent display region; and
a non-transparent display region adjacent to the transparent display region;
wherein the transparent display region comprises a plurality of film layers stacked in sequence and a conductive trace located between two adjacent film layers; the conductive trace is arranged in a preset function curve, and
wherein in the transparent display region, there are a plurality of conductive traces and the plurality of conductive traces are disposed in different layers.

2. The array substrate according to claim 1, wherein the conductive trace comprises a plurality of repeating units.

3. The array substrate according to claim 2, wherein the repeating units comprise multiple segments of sine function curves connected in sequence, and the sine function curves are periodically arranged in the repeating units.

4. The array substrate according to claim 2, wherein the repeating units comprise multiple segments of cosine function curves connected in sequence, and the cosine function curves are periodically arranged in the repeating units.

5. The array substrate according to claim 2, wherein the repeating units comprise multiple segments of cosine function curves connected in sequence, and any two adjacent segments of the cosine function curves have opposite directions.

6. The array substrate according to claim 4, wherein any two adjacent segments of the cosine function curves have different amplitudes.

7. The array substrate according to claim 2, wherein the repeating units comprise multiple segments of sine function curves and multiple segments of straight lines, and the sine function curves and the straight lines are connected in sequence and alternatively disposed apart.

8. The array substrate according to claim 2, wherein the repeating units comprise multiple segments of cosine function curves and multiple segments of straight lines, and the cosine function curves and the straight lines are connected in sequence and alternatively disposed apart.

9. The array substrate according to claim 1, wherein the plurality of conductive traces are disposed in a same layer.

10. The array substrate according to claim 1, wherein the conductive traces in the transparent display region comprise a plurality of first conductive traces and a plurality of second conductive traces, and the first conductive traces and the second conductive traces are arranged to transversely and longitudinally cross each other.

11. The array substrate according to claim 10, wherein the first conductive traces are arranged in a first preset function curve, and the second conductive traces are arranged in a second preset function curve.

12. The array substrate according to claim 11, wherein the first conductive traces are arranged in a sine function curve, and the second conductive traces are arranged in any one of a cosine function curve, a sine function curve or a straight line.

13. The array substrate according to claim 11, wherein the first conductive traces are arranged in a cosine function curve, and the second conductive traces are arranged in any one of a cosine function curve, a sine function curve or a straight line.

14. The array substrate according to claim 11, wherein the first conductive traces are arranged in a straight line, and the second conductive traces are arranged in any one of a cosine function curve or a sine function curve.

15. The array substrate according to claim 1, wherein the conductive trace is one of traces of a gate electrode, a source electrode and a drain electrode.

16. The array substrate according to claim 1, wherein the plurality of film layers comprise a base substrate, a TFT array layer disposed on the base substrate and a flat layer disposed on the TFT array layer.

17. A display panel, comprising: the array substrate according to claim 1, a light-emitting layer disposed on the array substrate and an encapsulation layer capped on the light-emitting layer.

18. An electronic device, comprising the display panel according to claim 17 and at least one photosensitive element disposed under a transparent display region.

19. The array substrate according to claim 1, wherein the non-transparent display region is arranged in a present function curve.

20. The array substrate according to claim 1, wherein an anode layer is further formed on the array substrate.

* * * * *